United States Patent [19]

Barton et al.

[11] 4,027,288

[45] May 31, 1977

[54] SELF-MANAGING VARIABLE FIELD STORAGE SYSTEM FOR HANDLING NESTED DATA STRUCTURES

[75] Inventors: Robert Stanley Barton, La Jolla; Gary Wesley Hodgman, Encinitas, both of Calif.

[73] Assignee: Burroughs Corporation, Detroit, Mich.

[22] Filed: Feb. 9, 1976

[21] Appl. No.: 656,280

[52] U.S. Cl. .......................................... 340/172.5
[51] Int. Cl.² ......................................... G06F 7/22
[58] Field of Search ............ 340/172.5; 360/50, 71, 360/72

[56] References Cited

UNITED STATES PATENTS

| | | | |
|---|---|---|---|
| 3,337,852 | 8/1967 | Lee et al. | 340/172.5 |
| 3,348,213 | 10/1967 | Evans | 340/172.5 |
| 3,525,080 | 8/1970 | Couleur et al. | 340/172.5 |
| 3,588,855 | 6/1971 | Scully | 360/50 |
| 3,731,278 | 5/1973 | Eldridge et al. | 340/172.5 |
| 3,766,529 | 10/1973 | McLaughlin | 340/172.5 |

OTHER PUBLICATIONS

IBM Reference Manual Magnetic Tape Units, 1961, pp. 8-9.

*Primary Examiner*—Gareth D. Shaw
*Assistant Examiner*—Thomas M. Heckler
*Attorney, Agent, or Firm*—Mervyn L. Young; Kevin R. Peterson

[57] ABSTRACT

This disclosure relates to a storage system employing a serial periodic memory as the storage mechanism. The storage mechanism has one or more control and access ports which control data transmission to and from the storage mechanism, each port including input and output devices associated with a data track of the storage mechanism. A queue shift register is coupled between the input and output devices to receive previously stored information characters which are to be temporarily held when newly received information characters are to be written into the storage media. Control of the system resides in the control ports and is activated by commands from the external sources. A character set is employed which includes a beginning delimiter character and an ending delimiter character such that information segments may be of any length up to the capacity of the storage mechanism. The system control ports manage, among other things, the explicit representation of the beginning and end of strings of data and the decomposition of strings into substrings, the automatic allocation and reclamation of unused storage space as strings of data increase or decrease in size, and the permission or prohibition of access to data strings depending on the requestor's identity. Data strings may be accessed according to their order or by symbolic addressing.

13 Claims, 4 Drawing Figures

FIG.2C
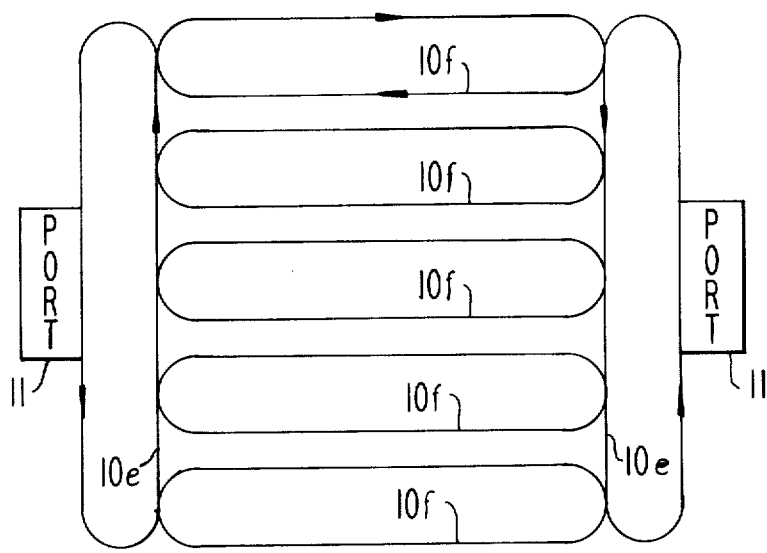
FIG.2D
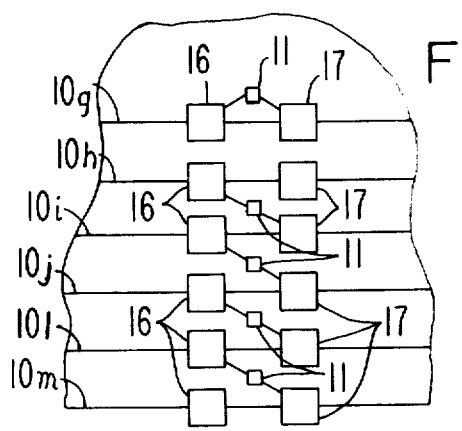
| CHAR | 1 | 2 |
|------|---|---|
| (    | 1 | 0 |
| 0    | 0 | 0 |
| 1    | 1 | 1 |
| )    | 0 | 1 |
FIG.3A
FIG.3B
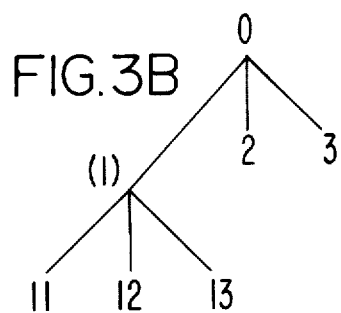
FIG.3D
((DATA) (DATA) ( ))
 X      f     fXf f
FIG.3E
((DATA)0000(DATA)( )1111)00
FIG.3C
0 = (((11)(12)(13))(2)(3))
(((NAME)(USER)(ACC))0000(FIRST)(SECOND)0000)1
FIG.3F

SELF-MANAGING VARIABLE FIELD STORAGE SYSTEM FOR HANDLING NESTED DATA STRUCTURES

BACKGROUND OF THE INVENTION

1. Field of Invention

This invention relates to a self-managing storage system for use with data processing and communication systems employing variable length fields that can be nested to any level and more particularly to such a system which provides item level security implemented directly at storage interface and wherein unused storage space can be allocated and reclaimed.

2. Description of the Prior Art

Prior art storage systems have evolved as an array of identical storage cells which were arranged in a rigid manner to accommodate parallel accessing. Parallel data transfer in data processing systems was employed to compensate for the relatively slow speeds of the switching elements employed in the system. Parallel data transfer, in turn, required a fixed width for data or information segments which greatly inhibited the accommodation of variable length fields and nested data structures. As a result, elaborate operating systems and other program mechanisms were created to handle the various data structures and to provide security and protection features. Such program simulation is, of course, relatively slow. Some of these program mechanisms have been implemented in circuitry with some success. However, the result is still cumbersome and greater improvement is desired.

Improvements in circuit components, particularly in integrated circuits, have allowed for the decentralization of the various functions in a data processing system. Large scale integrated circuit technology requires regularity and nondedication of specialized or complex functions to circuit chips. Distribution of functions throughout a number of similar or identical integrated circuit chips can accommodate serial data transfer without an undue reduction of throughput in the system. Serial data transfer both accommodates and may be implemented by a number of new storage devices such as charge coupled devices (CCD) magnetic bubble memories and also by improvements in magnetic disk memories which have greatly enhanced access times and storage capacities.

With prior art storage systems, the storage management, except as noted above, was provided by the central processing elements and the input-output controls. By implementing storage management within the storage device, applicational and system software becomes unnecessary for the storage management and can be eliminated. Those particular functions whose control desirably should be placed in the storage unit are the following:

retention of variable-length strings of symbols, up to an implementation-defined maximum;

automatic allocation and reclamation of unused storage space as strings of information increase or decrease in size;

explicit representation of the beginning and end of strings and the decomposition of strings into substrings;

access of storage strings by means of symbolic names;

storage of strings of information in ordered sets and access to them according to their order;

permission or prohibition of access to strings of information depending upon the identities of the sources of creation of those strings and which sources try to access them;

provision of optional internal representations of strings which optimize access speed by taking advantage of the physical structure of various storage media; and transmission of strings of information of variable lengths between the storage mechanism and external agencies according to a fixed discipline.

When a storage mechanism having the above described functions is applied to communications, word processing, and other less computational uses, a general processing element becomes unneeded in many products.

Since the employment of a serial mode of transmission and storage does not dictate a fixed information segment length or width, this mode of transmission and storage readily accommodates the implementation of the above described functions.

It is, then, an object of the present invention to provide a self-managing storage mechanism that can provide many information handling functions without the requirement of control by a central processing element.

It is another object of the present invention to provide a self-managing storage mechanism that can accommodate variable length data segments that may be nested to any level.

It is still another object of the present invention to provide a self-managing storage mechanism that will in turn provide item level security at the storage interface level.

It is still a further object of the present invention to provide a self-managing storage mechanism that automatically allocates and reclaims unused storage space.

SUMMARY OF THE INVENTION

In order to accomplish the above described objects, the present invention resides in a storage system having one or more control and access ports which system employs a serial periodic memory as the storage mechanism. A two bit four character set is employed which includes a beginning delimiter character and an ending delimiter character such that data transfer is serial by character.

The one or more control and access ports which are provided for data transmission to and from the storage mechanism include a reading mechanism and a writing mechanism associated with each of the one or more data tracks of the periodic storage device. Coupled between the reading mechanism and the writing mechanism are an access shift register and a queue shift register. The access shift register is employed to receive incoming information segments from an external source which segments are to be written into the storage media and to receive information segments from the storage media for transmission to an external source. The queue shift register is employed to receive previously stored information characters which are to be temporarily held while newly received information characters are to be written into the storage media. A character generator is coupled to the access shift register to supply additional characters as might be required for control and management purposes.

A feature, then, of the present invention resides in an information storage system having a serial periodic storage device and one or more control and access ports for writing information segments into the storage device and receiving information segments therefrom, which ports are provided with a queue to receive previously stored characters that are to be temporarily held while new characters are being written into the storage device.

Another feature of the present invention resides in such a storage system wherein each of the ports is provided with means to detect and generate a character selected from a character set including two control characters which are used as a beginning delimiter character and an ending delimiter character such that information segments may be of any length up to the total capacity of the storage mechanism.

The system of the present invention enables the individual requestor (a terminal, processor or a running process) which introduces an item of information (data/program) into the store to determine the conditions under which access is to be allowed whether by that requestor or other requestors.

This system also provides a method for storing information in files consisting of an arbitrary number of ordered fields which may be addressed according to their ordinal position, which fields may be of arbitrary length ranging from empty to a size bounded only by the capacity of the store.

This system further provides for recursive grouping of an arbitrary number of files into an ordered file.

This system provides for a coded distinction between occupied space (valid information) and unoccupied space and a mechanism either associating such unoccupied space with particular fields or files or with an aggregate of fields or files (the enclosing file).

The system provides for referencing a field or file by an ordered sequence of index numbers in such manner as to be independent of field/file sizes.

The system provides for referencing fields/ files, contained in an unordered file, by an ordered sequence of one or more tags and allows one or more aliases for each tag.

The system also provides for referencing a field/file contained in a nest of files any of which may be ordered or unordered.

The system provides for internal description of a hierarchical file structuring empty space and necessary control using any decodable character set which reserves two characters for embedded structure.

The system further provides for external description of hierarchical file structure represented in any character set using external descriptions with embedded structure.

The system provides for mixing of several character sets in the same file.

The system further provides for open-ended descriptions usable for classification or typing, protection and provisions for security and privacy.

The system allows for management of empty space.

DESCRIPTION OF THE DRAWINGS

The above described and other objects, advantages and features of the present invention will become more apparent from a review of the following specification when taken in conjunction with the drawings wherein:

FIGS. 2a–2d illustrate various types of periodic storage mechanisms that may be employed with the present invention;

FIG. 3a is a representation of the four character set employed by the storage system of the present invention;

FIG. 3b is an illustration of a tree structure that may be employed to represent any series of nested routines;

FIGS. 3c–3f are representations of different types of information segments as might be formed in the present invention utilizing the character set of FIG. 3a.

GENERAL DESCRIPTION OF THE SYSTEM

Figure 1:
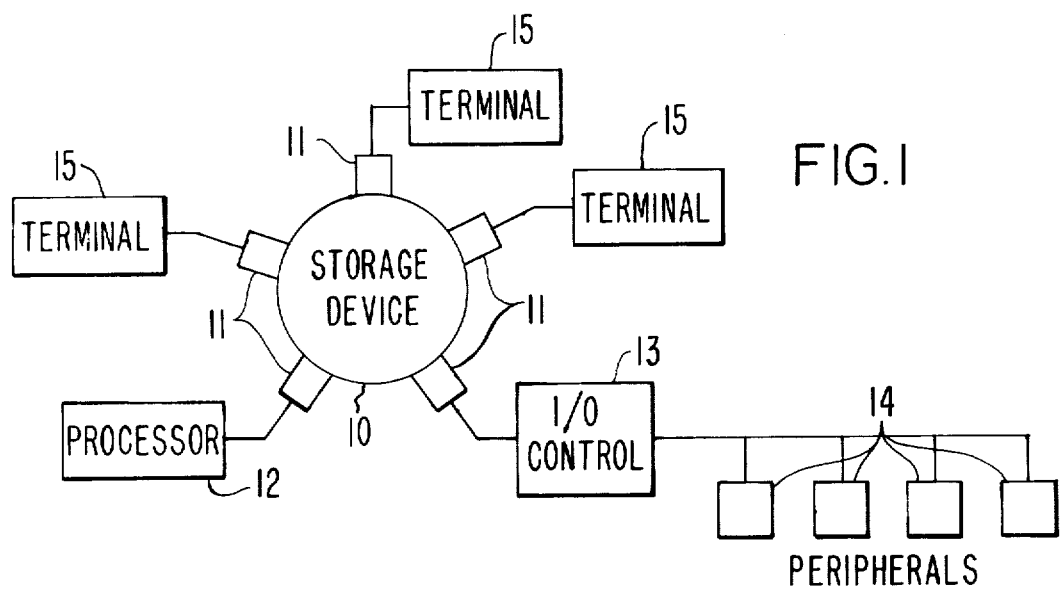
FIG. 1 is a diagram of a system representing an environment for the present invention.

A system in which the present invention may be employed is illustrated in FIG. 1. This system may employ one or more storage devices such as storage device 10 for which a plurality of control and access ports 11 are provided. In a normal data processing environment, ports 11 control the data transmission to processor 12 and I/O control unit 13 which in turn controls data transfer to plurality of peripheral devices 14. In addition, one or more terminals 15 may be individually connected to a respective port 11 for information retrieval from storage device 10. As was indicated above, when the work load of the system is of an appropriate nature, processor 12 or I/O control unit 13, or both, are not required and may be removed from the system.

Figure 2A:
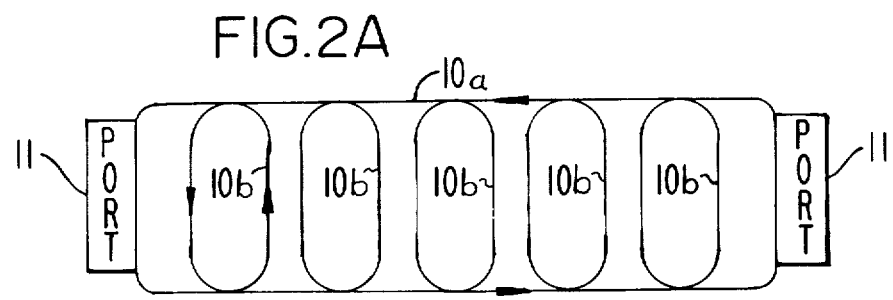
Figure 2B:
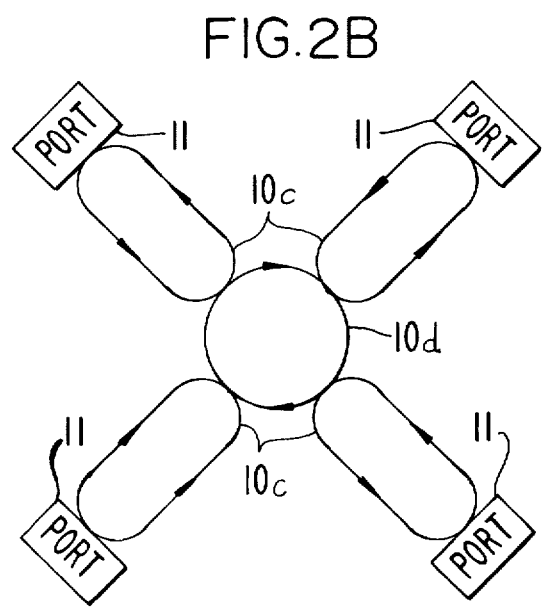

Illustrations of the types of serial periodic memories that may be employed in the present invention and the manner in which a number of different control and access ports may be coupled thereto are provided in FIGS. 2a–2d. FIGS. 2a–2c illustrate various configurations of loop transfer paths such as might be employed in charge coupled devices (CCD's) and magnetic bubble or single wall magnetic domain memories. It will be understood by those skilled in the art that such memories are dynamic and that the individual data segments are circulated in the respective loops or can be transferred from one loop to another and hence to an appropriate access port. In FIG. 2a, data segments in any one of the storage loops 10b may be transferred to either port 11 by way of access loop 10a. In FIG. 2b, each of the respective ports 11 is provided with its own storage loop 10c; however, data may be transferred between the respective storage loop 10c by way of transfer loop 10d. In FIG. 2c, each of the respective ports 11 is provided with its own access loop 10e to and from which data may be transferred to the respective storage loop 10f.

FIG. 2d is an illustration of a different type of periodic storage, namely a magnetic disk with fixed heads. As illustrated in FIG. 2d, each storage track of the disk may be treated as a separate storage loop such as track 10g where both the read head 16 and write head 17 for that track are coupled to an individual access port 11. Otherwise, two or more of the storage tracks can be coupled together to form a single large storage loop where the read head 16 for one track and the write head 17 for an adjacent track are coupled to an individual access port 11. To complete this loop, read head 16 for storage track 10m is coupled to write head 17 of storage track 10h by way of an access port not shown. In a similar manner, one or more tape units can be employed as the storage mechanism of the present invention.

A character set from which the variable information structures may be formed is illustrated in FIG. 3a. Each character comprises two bits that allows for four different characters, which, as illustrated in FIG. 3a, are (,), 0, and 1. Throughout this description, the opening and closing delimiters may be referred to as parentheses or brackets and it will be understood that those three terms are used interchangeably. It will be further understood that since data transfer is serial by character, each of the respective storage tracks and loops described above represent a two bit wide data path. In an alternative embodiment, data transfer can be serial by bit if a two phase clock is employed to allow for appropriate synchronization.

A particular feature of the character set as illustrated in FIG. 3a is the parity or error check which is provided. As will be described below, for each opening delimiter or bracket character in a structure or field, there will be a closing delimiter or bracket character, each of which characters is comprised of a single one bit and a zero bit. Furthermore, the data characters will either have no one bits or two one bits. Thus, all structures or fields within a structure, will have an even number of one bits if the structure has been properly coded. This provides an even parity checking scheme as well as serving to indicate when a complete structure has been transferred.

Data and information structure formats formed from the above described character set will be further described below in relation to FIGS. 3c–3f. These structure formats define a series of what are generally referred to as data or information cells from which fields are formed (a field may be any number of such cells or just a single cell). Certain rules of construction are to be applied to the interpretation of such a format. For example, each field will be enclosed by a beginning delimiter or bracket and an ending delimiter or bracket. Furthermore, each information structure will begin with an adjacent pair of beginning delimiters and will end with that number of ending delimiters necessary to balance out the delimiter count as was referred to above and will be more thoroughly described below. In this manner, any information structure can be formed of a series of substructures that can be nested to any level.

A representation of the manner in which any process or routine may be formed of a series of nested subprocesses is provided in FIG. 3b wherein process or routine 0 comprises subprocesses 1, 2 and 3 where subprocess 1 is formed of a lower level of subprocesses 11, 12 and 13. FIG. 3c illustrates the manner in which the respective subprocesses representing the overall process would be stored in the storage mechanism of the present invention. Since the various subfields or subprocesses can be nested to any level, it would be understood that the information segment represented by FIG. 3c can be expanded up to the maximum amount of storage available in the memory.

Some additional rules of construction will now be described in relation to FIG. 3d. Data may not be stored between certain pairs of delimiters. For example, data may not be stored between a contiguous pair of opening delimiters or between a contiguous pair of an opening delimiter and an ending delimiter. This is indicated in the information structure of FIG. 3d as the spaces above the x's in that Figure. Furthermore, data may not be stored between an ending delimiter and an opening delimiter. Space between an ending delimiter and an opening delimiter is considered as "free space" for future expansion of adjacent fields. Additionally, free space may exist between adjacent pairs of closing delimiters and in general after any closing delimiter.

Free space is indicated in the structure of FIG. 3d as that space over the various letters f. If the free space is generally available, and unreserved, it is filled with a string of one or more zeros (0). If the free space is exclusively reserved for expansion of an adjacent field it is filled with a string of one or more ones (1). Fields whose free space is reserved may not be expanded beyond the bounds of that space.

When a field is rewritten to contain fewer data symbols than before, the space difference is converted into free space. When a field is enlarged, the increase is taken from the field's free space. If that is insufficient, succeeding fields are shifted into subsequent free space areas, creating additional room next to the enlarging field until sufficient space is obtained. If this allocation process ever consumes the entire unreserved free space area, an error signal is generated and the enlarging field is marked as unavailable for any operation except one which deletes data symbols.

FIG. 3f is a representation of an information structure indicating that the first set of fields are description fields which are employed in order to categorize, qualify, modify and interpret data. Some properties have to do with naming strings, encoding symbols, accommodating fields without parameters, and otherwise fulfilling basic functions of the storage system. The properties thus named are mandatory. Optional properties include those which help control the execution of programs, those which affect the semantics of operators, and those which help model primitive properties of data structures as needed by applicational systems.

The description field includes a name field, a user's properties field, and an information properties field. Properties of fields may be represented by null or absent fields, denoting default values. Properties of a field shall be understood to be the same as those of the immediate parent field, unless respecified in the field's description.

The name field is provided so that each subfield in an unordered context shall have a "name" which is a unique string of symbols. In an ordered context, symbolic names are optional because the field's ordinal position, being unique and unalterable, can be used instead.

The user's properties fields include a security field which provides the owner's identification with identifications and the privileges of other users and also provides a log of all accesses and/or a log of all unauthorized access attempts. If the former log is provided, it will be stored elsewhere in the system to prevent an access entry from being modified. User's properties fields also are provided to assist the execution of programs by specifying data types, usage statistics and fault handling.

Information properties are properties specifying the name convention (subfields are named or indexed), character set encoding, data limits, indication of a logical global field and mapping. The mapping properties, which are not available to the user, include a request bit; map or map name; whether the map is a single-level, multi-level, or full; sizes or absolute addresses; external description; and placement requests.

A "type" field may be provided so that each field which has subfields shall have a type property which specifies whether or not the order of the subfields is to be maintained. A character set field is provided so that each field whose contents are encoded differently from the transmission alphabet of FIG. 3a shall have a "character set" property which describes the alternative encoding. Examples of such descriptions include translation tables, decoding trees for Huffman codes, or names of alternative alphabets.

Every field in the storage system (except description fields) shall be located by means of a unique sequence of names which distinguishes it from all other fields. This unique sequence is, by definition, an ordered set of names such that: the first name is that of the global field's subfield which ultimately contains the field; the next name is that of the next-level subfield which ultimately contains the field, or as many names as is necessary; and the last name is that of the field. Such sequences are called name vectors and will be written as "((first name) (next name) ... (last name))". Description fields shall be located by means of special names.

Whenever a field has ordered subfields, they may be located by means of their ordinal position. The first subfield shall have a position zero, the second position one, and so on. Ordinal positions may be called indices and a name vector may contain both names and indices. The name vector which consists entirely of indices may be called an index vector. It will be noted that description fields are defined to have no ordinal position and cannot be located by an index value. If ordered subfields have names, the names may be used to locate them. The conventional storage term "absolute address" corresponds to the very special case of only one name (index).

In order to access symbols in storage for which conventional name vectors cannot be constructed (such as contents of description fields), several special names shall be recognized. One special name shall designate the global field. The appearance of this name is reasonable only at the beginning of the name vector. One special name shall designate the next unmatched ending delimiter ")". Invocation while positioned at the delimiter of or free space of global fields causes an error signal to be generated. One special name shall designate the next opening delimiter which is at the same depth as the current symbol. Observe that the "next" field when positioned at a data symbol is the adjacent data symbol or an ending delimiter if at the end of structure. One special name shall designate the previous opening delimiter at the same depth as the current symbol. The "previous" field when positioned at a data symbol is the adjacent data symbol or an opening delimiter if at the beginning of the structure. One special name shall designate the previous opening delimiter at less depth than the current symbol. Invocation while positioned at delimiters of the free space of the global field causes an error signal to generate.

The accessing and handling of the various data structures described above is performed by the control and access ports 11 of FIG. 1. Control and access ports 11 provide 16 different functions which are initiated by commands sent from the external devices. These various functions or operations may be divided into two categories: an "internal machine" which controls the storage mechanism directly and an "external machine" which controls transmission to and from the storage mechanism.

The external functions include eight basic operations which every implementation of the storage mechanism shall respond to as follows.

The Define Field operation causes a new pair of field delimiters to be added to the storage mechanism; a description field is constructed; any free space is provided for as required; and substructures are built using another field as a template.

The Delete Field operation deletes a pair of field delimiters and the entire structure enclosed by them.

The Field Defined Inquiry operation determines whether or not a field of a given name exists in the storage mechanism.

The Replace Field operation replaces a field's contents with a string of symbols entering on the ports data line.

The Extract Field operation extracts a field's contents and sends the string out on the data line, leaving a null string as the field's new contents.

The Copy Field operation sends a duplicate of the field's contents out on the data line.

The Field Contents Inquiry operation determines whether or not a field has a non-null string as its contents.

The Append Field operation adds a new last subfield and stores a string of symbols from the data line into that subfield.

The internal functions also comprise eight operations which are carried out internally and are not directly controlled by any external device. These internal functions are as follows.

The Position According To Name Vector operation moves the point of access to storage symbols to the start of the field whose name is received on the Name Vector line.

The Insert Field operation adds a new field to the storage mechanism at the present point of access.

The Delete Field operation deletes the field presently accessible.

The Assign Field operation overwrites a field's contents with new data, expanding or contracting the field's size as required.

The Output Field operation transmits a field's contents out on the Data line.

The Set Local Origin operation records the present point of access.

The Position According to Local Origin operation changes the point of access to that recorded in a given local origin.

The Clear Local Origin operation discards a recorded point of access.

DETAILED DESCRIPTION OF THE SYSTEM

Figure 4:
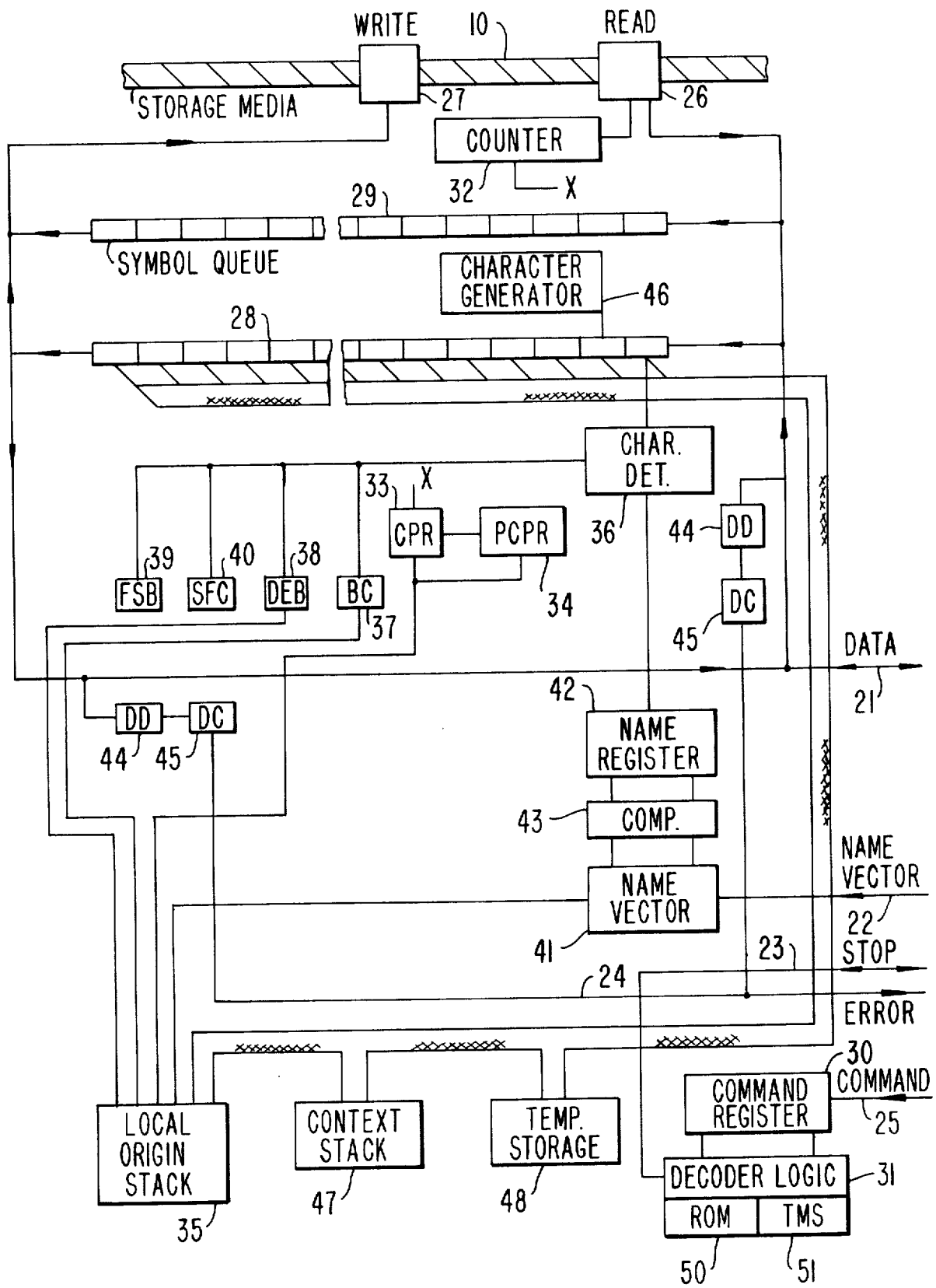
FIG. 4 is a schematic representation of the control and access port as employed in the present invention.

Control and access ports 11 of FIGS. 1 and 2a–2d will now be described with reference to FIG. 4. As illustrated therein, information symbols are read from storage media 10 by output device 26 and written into the storage media by way of input device 27. In turn, information symbols are transferred to and received from an external unit by way of a control unit interface that includes Data line 21 which is a bidirectional transmission line, Name Vector line 22 which is an incoming transmission line, Stop line 23 which is a bidirectional transmission line, Error line 24 which is an outgoing transmission line and Command line 25 which is an incoming transmission line. When the character set of FIG. 3a is employed, it will be understood that at least the data lines and the storage media tracks are preferably repeated in parallel so as to form a two bit wide data transfer path throughout the system.

Incoming information characters which are received from an external unit are transferred to Access shift register 28 and then to write head 27 for storage in the storage media 10. Characters read out of the storage media by read head 26 are transferred to Access shift register 28 and then to Data line 21 for transmission to the external unit. Symbol Queue register 29 is provided to temporarily hold characters that are to remain in the memory system but which have been read out so as to allow new information characters to be written into those same particular locations.

Control of any operation performed by the control unit is initiated by the external unit or user by supplying a command by way of Command line 25 to Command register 30 where the command is decoded by decoder logic 31 which includes ROM memory 50 and machine state timing (TMS) unit 51. In ROM 50 are stored the various control signals required to be transmitted to the various elements of the control unit by way of control lines not shown in FIG. 4. The various commands that can be executed by the control unit of FIG. 4 are further discussed below.

Since the storage mechanism is a serial periodic device, each storage location in the mechanism can pass by read head 26 with a certain periodicity. Memory storage location then can be identified by the contents of counter 32 if that counter is set to zero each time the beginning location of the storage device is positioned at read head 26. In order to identify the position of each symbol stored in the storage media, the contents of counter 32 are transferred to Current Position register 33 at a time coinciding with the symbols entry into the storage media. Should the contents of Current Position register 33 be required to be detained for a short period of time, it may be transferred to Previous Current Position Register 34. Otherwise, it is transferred to Local Origin stack 35 for reasons that will be more thoroughly described below.

As was generally indicated above, various fields may be located according to their order in a nested information structure by counting the number of beginning field delimiters which have not been matched by ending field delimiters. To this end, character detector 36 is provided to detect the type of character that has been entered into Access shift register 28. As additional characters are entered into shift register 28, the delimiter Balance Count is incremented or decremented in Balance Count register 37. The absolute maximum count that may be accommodated is N/2, where N is the maximum character capacity of the entire storage system. Character generator 46 is provided to supply delimiters to shift register 28 as required.

Other information that can be detected and stored include the determination of whether the field currently being referenced has a Description field and to this end, Description Bit true/false indicator 38 is provided. If the position currently being referenced contains a free space bit, Free Space Bit indicator 39 is set. Subfield counter 40 is provided to maintain a subfield count when ordered fields are being indexed.

When various fields are accessed according to their name field, Name Vector register 41 is provided to receive Name Vectors from the external unit by way of Name Vector line 22. It is required that the Name Vector register have a capacity to hold Name Vectors for any possible nested field. There may be as many names in a vector as there may be unmatched beginning delimiters to the left of any symbol. In order to access the fields according to their Name, Name register 42 is provided to receive the Name field from an information structure as it is entered into access shift register 28 fro storage media 10. Comparator 43 is provided to compare the contents of Name register 42 with that of Name Vector register 41. When the appropriate comparison occurs, then the current field may be read out of shift register 28 to the external device via Data line 21.

In order to insure no error in data transmission to or from the external device, the delimiter count is maintained during the transmission of each information structure. At the end of that transmission, the delimiter countshould be zero. To this end, delimiter detectors 44 are coupled to the incoming and outgoing Data lines and in turn increment and decrement delimiter counters 45.

Context stack 47 is provided to hold the combined properties which may be inherited by any field, excluding names (which are maintained in the current Name Vector). To this end, Context stack 47 is coupled to a plurality of locations of Access shift register 28. It should be noted that as the Current Position leaves a field which respecified some property of a superfield, the former value of the property must be restored. In general, this requires all properties to be maintained in the stack.

In order to access any field, Local Origin stack 35 is provided to retain information about the position of recently accessed fields so that subsequent accesses can be made directly or with limited repositioning. Six types of information, referred to as a Local Origin, are stored in the stack. This information includes the Physical Position of the field in the storage media, the Balance Count for that physical position, the Name Vector for that physical position, the Description bit for that physical position, the Context of that physical position, and a Validity Bit whose state reflects whether or not the symbol in that position is the same as when the local origin was created. When various storage operations cause symbols which are pointed to by the local origins to shift position, then each local origin shall either have its position adjusted by the amount of the shift or shall be marked invalid.

Temporary Storage 48 is provided to temporarily hold Description fields, Name Vectors and fields in general as required for the execution of various commands that are discussed below.

In addition, certain User's Files are stored in the storage mechanism itself. These include a Security File which contains specifications (generated by the "owner" of the data file of which the description file is a part) that control access to and functions performed in that data file. Other user's files are a Data Type File which contains contextual information intended for use by the processors that are accessing data and an Exception file which contains specifications of alternate action for the storage system to take in case of exceptional conditions or errors.

COMMANDS

In order to illustrate the versatile operation of the system of the present invention, various commands will now be described which commands are initiated by a requesting device and are transmitted to Command register 30 of FIG. 4.

The above-referred-to "internal" commands will first be described. The internal commands do not provide security or protect the field properties on whose integrity all user operations depend.

Position According To Name Vector Command causes the control unit to receive the Name Vector on its Name Vector line. Each successive field of the Name Vector is used to select a progressively deeper subfield, as determined from the Current Position. Should a security field be found in any selected subfield's description, it is transmitted on the Data line to the external machine and a true/false signal is received on the Command line to either permit or prohibit further positioning. This command includes the step of searching for a description field which contains the name that matches the next name received on the Name Vector line and the ability to index to the nth symbol in a record.

Insert Command causes the control unit to accept symbols which constitute a field on the Data line and to enter them into the storage mechanism serially, beginning at the current symbol position. Information symbols which reside in positions to be overwritten are shifted right, filling empty space. Local origins which point to shifted symbols are updated. The final current position immediately follows the inserted material. If the initial position is on a data symbol and if the new contents is a simple record, then the new contents merely expand the current field, rather than create a new peer. Delimiters on the new contents are discarded.

Delete Command causes the control unit to examine the current symbol and, if that symbol is a beginning field delimiter, to delete the entire field by overriding with free space symbols. If the current symbol is an ending field delimiter, the command causes the control unit to move the following free space by shifting to its parent field's end. If the current symbol is data, this command causes the control unit to delete the remaining symbols by shifting the remainder of the field up and by inserting a corresponding number of free space symbols in the field's free space. If the current symbol is free space, an error is reported. Finally, the storage mechanism is positioned at the next field, if any, or otherwise at the ending delimiter of the superfield. This command includes the step of "bubbling" free space to the end of a field.

Assign Command causes the control unit to accept symbols on the Data line and maintain a balance count for them. The symbols are then entered into the storage mechanism serially, beginning at the current symbol position. The existing fields in the storage mechanism are overwritten and, if necessary, so is any existing free space. Local origins, which point to subsequent fields that were moved to make room for new symbols, are updated. Finally, the storage mechanism is positioned to the next field.

Output Field Command causes the control unit to send symbols, starting with the one most recently positioned to, out on the Data line. Unreserved free space is deleted but reserved free space is transmitted. The process is continued until a complete field has been transmitted. The storage mechanism is then positioned to the next field.

Set Local Origin Command causes the control unit to receive an identification of a local origin on the Name Vector Line. The unidentified origin is selected and copied into the current command logic state.

Position According To Local Origin Command causes the control unit to receive an identification of a local origin on the Name Vector Line and to select the identified local origin and copy its contents into corresponding elements of the command logic.

Clear Local Origin Command causes the control unit to receive an identification of a local origin on the Name Vector line and to select the identified origin to be marked as invalid.

The external commands will now be described. Implementation of these commands contains two features. Serial operation is accommodated and favored (i.e., knowing the lengths of fields is never necessary, and information at the end of a string is never needed in order to process information at the front of a string). Secondly, only one point of access to stored symbols is required (e.g., end of a shift register, movable head of a disk, a tape read/write head).

Define Field Command. The parameters of this command are the Owner's Identification, Name Vector of the field's superfield, Name of field to be created, Name Vector of the template for the field's substructure, Naming Convention for subfields, Maximum desired size of field, whether or not to guarantee maximum space. This command generates a new pair of delimiters in storage. If the new field is to have a description field, this command supplies the values for all of the mandatory properties. If the new fields are to be of bounded size, this command records its limitation.

Delete Field Command. The parameters of this operator are the Requestor's Identification, Name Vector of the field's superfield, and the Name of the field to be deleted. The function of this operator is the opposite of the Define Field operator. The Delete Field operator removes a field and its substructure from storage. Space occupied by the record is returned to its superfield's free space. Only the owner or his designees may delete a field.

Field Defined Inquiry Command. The parameters of this operator are the Requestor's Identification and the Name Vector of the field to be interrogated. This operator determines whether or not a field exists by attempting to position it. If the requestor is not authorized to perform at least one operation on the field or on its superfields, the operator will terminate abnormally.

Replace Field Command. The parameters of this operator are a Result Selector, Requestor's Identification, Name Vector of the receiving field, and the New Contents for the receiving field. This operator supplies a new contents string which supersedes the contents of the field named by the Name Vector. The receiving field's properties must conform with those of the new contents in order for the transfer to take place. Specifically, both fields must be ordered or both must be unordered; and the new contents must be smaller than the maximum size specified for the receiving field. If larger contents are supplied in the maximum size of the receiving field, the contents are stored but the operator terminates abnormally. The Result Selector selects whether the new contents or the name of the receiving field are to be returned as the result of the operation.

Extract Field Command. The parameters of this operator are the Requestor's Identification, Name Vector of the field to be extracted, and Extract Only Value or all properties of the field. This operator causes the transfer of the contents of a field out, leaving a null string as the field's new contents, or deleting the whole field if all properties are extracted. If the requester is not authorized to access the contents, the operator aborts before any symbols have been transferred out.

Copy Field Command. The parameters of this operator are the Requestor's Identification, Name Vector of the field to be copied, and a Copy Only Value or all properties of the field. This operator causes the transfer of a copy of the contents of a field out. The field is unchanged. If a requestor is not authorized to access the contents, the operator aborts before any symbols are transferred.

Field Contents Inquiry Command. The parameters of this operator are the Requestor's Identification and the Name Vector of the field to be interrogated. This operator determines whether or not a field contains more than one null string. If the requester is not authorized to access the field or any of its superfields, the operator will terminate abnormally.

Append Field Command. The parameters of this operator are the Requestor's Identification and the Name Vector of the field that is to be appended. This operator positions the storage system to the end of the field named by the Name Vector parameter, accepts a new field on the Data line and adds that new field as the last subfield. While this operation could be performed by the sequence "Define Field, Replace Field," that would imply permission to create, change, and read other subfields. The purpose of the Append operator is to allow appending without allowing any operation on existing subfields.

EPILOGUE

A storage system has been described which is capable of self-management so as to respond to commands from various requesting units without the need for control by a central processor or an I/O processor. The system employs a serial periodic storage mechanism so as to accommodate variable length fields that may be nested to any level. Management and accessing of the various nested fields is under control of one or more command and access ports coupled to the storage mechanism.

The system, as described, allows for explicit representation of the beginning and end of various strings and the decomposition of such strings into substrings. The system further allows the accessing of storage strings by means of symbolic means as well as the storage of strings in ordered sets and accessing of them according to their order. The system allows permission or prohibition of access to strings of information depending upon the identities of the sources which try to access them. Last but not least, the system allows automatic location and reclamation of unused storage space as strings of information increase or decrease in size.

While specific embodiments of the present invention have been described, it will be understood by those skilled in the art that variations and modifications may be made therein without departing from the spirit and the scope of the invention as claimed.

What is claimed is:

1. A variable field storage system for storing variable length data field segments, each of which starts with a beginning delimiter character and ends with an ending delimiter character, said system being capable of containing free space between said segments, said system comprising:
   a serial periodic storage media;
   an input device coupled to said storage media;
   an output device coupled to said storage media;
   an input/output data bus;
   an access shift register means coupled to said input device and said output device and to said input/output data bus to receive data segments from said data bus for transmission to said input device and to receive data segments from said output device for transmission to said data bus; and
   a queue shift register means coupled to said input device and said output device to receive from said output device data segments that are to be temporarily retained to provide storage space for new data segments that are supplied to said input device from said access shift register when free storage space is available between stored segments.

2. A storage system according to claim 1 which further includes:
   a command bus to supply commands;
   a command register coupled to said command bus to receive various commands to be carried out by said system; and
   decoder means coupled to said command register and to said other registers and devices to decode commands received by said command register and to supply control signals to said other registers and devices.

3. A storage system according to claim 1 including:
   a name tag bus to supply name tags;
   a name tag register coupled to said name tag bus to receive one or more name tags; and
   comparator means coupled to said access shift register means and to said name tag register to compare various data field segments with name tags received by said name tag register.

4. A variable field storage system for storing variable length data field segments, each of which starts with a beginning delimiter character and ends with an ending delimiter character, said segments being capable of being nested to any level as determined by the number of beginning delimiter characters previously not matched by ending delimiter characters during the scanning of each segment from the beginning of an initial segment, said system comprising:
   a storage media;
   a serial input means coupled to said storage media;
   a serial output means coupled to said storage media; and
   a delimiter balance counter means coupled to said serial output means to maintain a count of the number of beginning delimiter characters for a given field segment which have not been matched by an ending delimiter character.

5. A storage system according to claim 4 including:
   an access shift register coupled to said input and said output means, said delimiter balance counter being coupled to said access shift register to maintain a count of said beginning and ending delimiter character as field segments are transferred from said output means to said access shift register.

6. A system according to claim 5 which further includes:
   a name tag bus to supply name tags and ordinal values;
   a name tag register coupled to said name tag bus to receive either name tag indicating a field stored in said storage media or an ordinal value representing the position of said field in said storage media; and
   a comparator means coupling said name tag register to said balance counter to determine when a field exists in said access shift register which field has the ordinal position corresponding to the ordinal positions received by said name tag register.

7. A variable field storage system for storing variable length data field segments each of which starts with a beginning delimiter character and ends with an ending delimiter character, said system being capable of containing free space between said segments, said system comprising:
a storage media;
serial input means coupled to said storage media;
serial output means coupled to said storage media;
means coupled to said storage media to detect said beginning delimiter characters and said ending delimiter characters; and
free space detection means coupled to said storage media to detect the existence of a data character immediately following an ending delimiter character.

8. A storage system according to claim 7 further including:
an access shift register coupled to said input and output means and to which said free space detection means is coupled.

9. A system according to claim 8 further including:
a character generator coupled to said access shift register to supply additional characters thereto.

10. In a variable field storage system for storing variable length data field segments, each of which starts with a beginning delimiter character and ends with an ending delimiter character, said system being capable of containing free space between said segments, said system including a serial periodic storage media, a character generator coupled to said storage media and means to write over characters previously stored in said media, the method comprising;
detecting a beginning delimiter character of a field segment in said storage media;
counting a prescribed number of character positions following said detected beginning delimiter character;
generating an ending delimiter character and also data characters which are all of one kind after said generated ending delimiter character; and
writing said generated characters over previously stored characters in said storage media at a position starting after said counted positions, said characters all of one kind indicating free space.

11. A method according to claim 10 which further comprises:
writing over characters which are all of one kind after an ending delimiter character; and
generating an equal number of said characters all of one kind after a succeeding ending delimiter character, said characters all of one kind indicating free space.

12. In a variable field storage system for storing variable length data field segments, each of which starts with a beginning delimiter character and ends with an ending delimiter character, said segments being capable of being nested to any level as determined by the number of beginning delimiter characters previously not matched by an ending delimiter character during the scanning of each segment from the beginning of an initial segment, said system including a delimiter balance count register, the method comprising:
incrementing said balance count register each time a beginning delimiter character is detected in a field segment; and
decrementing said balance count register each time an ending delimiter character is detected in said field segment such that the contents of said balance count register indicates the level of nesting of a current segment.

13. A method according to claim 12 which further includes:
maintaining a count of all beginning delimiter characters at a given level which are unmatched by an ending delimiter character so as to specify the ordinal position of the respective fields within said beginning and ending delimiter characters at said given level.

* * * * *